(12) United States Patent
Kraus et al.

(10) Patent No.: US 7,025,027 B2
(45) Date of Patent: Apr. 11, 2006

(54) CHANNEL-SHAPED CONNECTION DEVICE FOR ELECTRICAL LINES OF INTERNAL COMBUSTION ENGINES

(75) Inventors: Markus Kraus, Jenbach (AT); Florian Virchow, Celle (DE)

(73) Assignee: Jenbacher Aktiengesellschaft, (AT)

( * ) Notice: Subject to any disclaimer, the term of this patent is extended or adjusted under 35 U.S.C. 154(b) by 0 days.

(21) Appl. No.: 10/240,296

(22) PCT Filed: Mar. 30, 2001

(86) PCT No.: PCT/AT01/00092

§ 371 (c)(1),
(2), (4) Date: Jun. 5, 2003

(87) PCT Pub. No.: WO01/76020

PCT Pub. Date: Oct. 11, 2001

(65) Prior Publication Data

US 2004/0020202 A1    Feb. 5, 2004

(30) Foreign Application Priority Data

Mar. 30, 2000 (AT) ................................ A 541/2000

(51) Int. Cl.
*F02P 15/00* (2006.01)

(52) U.S. Cl. ................................. 123/143 C

(58) Field of Classification Search ............ 123/143 C
See application file for complete search history.

(56) References Cited

U.S. PATENT DOCUMENTS

| | | | | |
|---|---|---|---|---|
| 2,509,093 A | * | 5/1950 | Field | 123/143 C |
| 4,034,271 A | | 7/1977 | Palazzetti et al. | 361/332 |
| 4,827,372 A | | 5/1989 | Day | |
| 5,109,828 A | * | 5/1992 | Tagami et al. | 123/635 |
| 5,390,648 A | * | 2/1995 | Yanase | 123/634 |
| 5,597,980 A | * | 1/1997 | Weber | 123/143 C |
| 5,771,850 A | * | 6/1998 | Okada | 123/143 C |
| 6,247,435 B1 | * | 6/2001 | Munz et al. | 123/143 C |
| 6,494,193 B1 | * | 12/2002 | Weingaertner et al. | 123/143 C |
| 2003/0230293 A1 | * | 12/2003 | Maekawa et al. | 123/143 C |

FOREIGN PATENT DOCUMENTS

| | | |
|---|---|---|
| EP | 0 607 335 B1 | 10/1991 |
| WO | WO 93/07029 | 4/1993 |

* cited by examiner

*Primary Examiner*—Erick R Solis
(74) *Attorney, Agent, or Firm*—Lorusso & Associates

(57) ABSTRACT

The invention relates to a channel-shaped connection device for electrical lines, especially signal and ignition lines, of internal combustion engines. At least one support element (2) is provided for preferably pre-assembled electrical lines (3) and components (7) and can be inserted, preferably pushed into receiving elements (4) of the channel-shaped connection device (1).

46 Claims, 5 Drawing Sheets

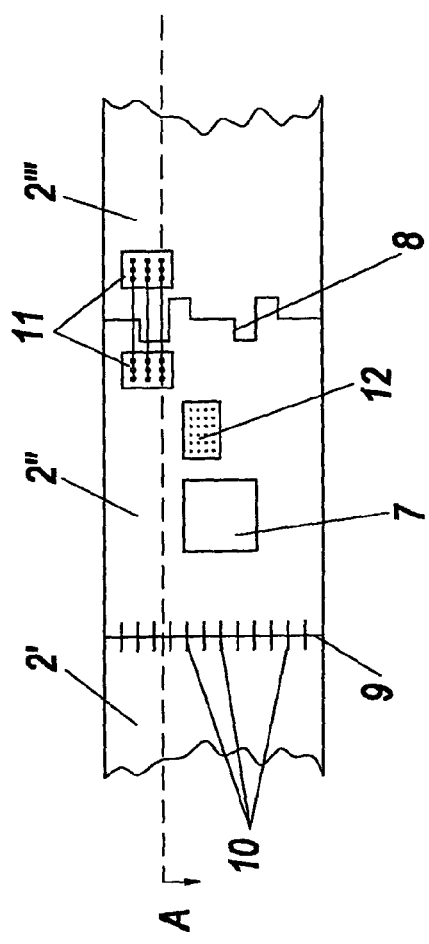
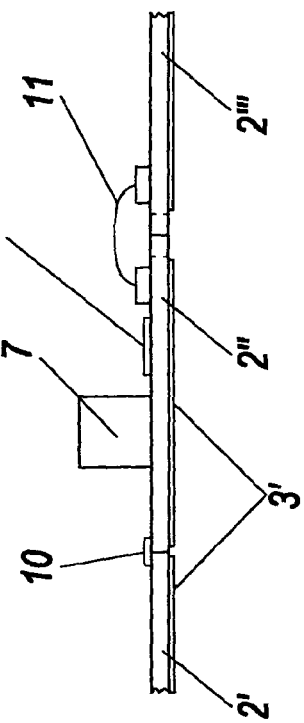
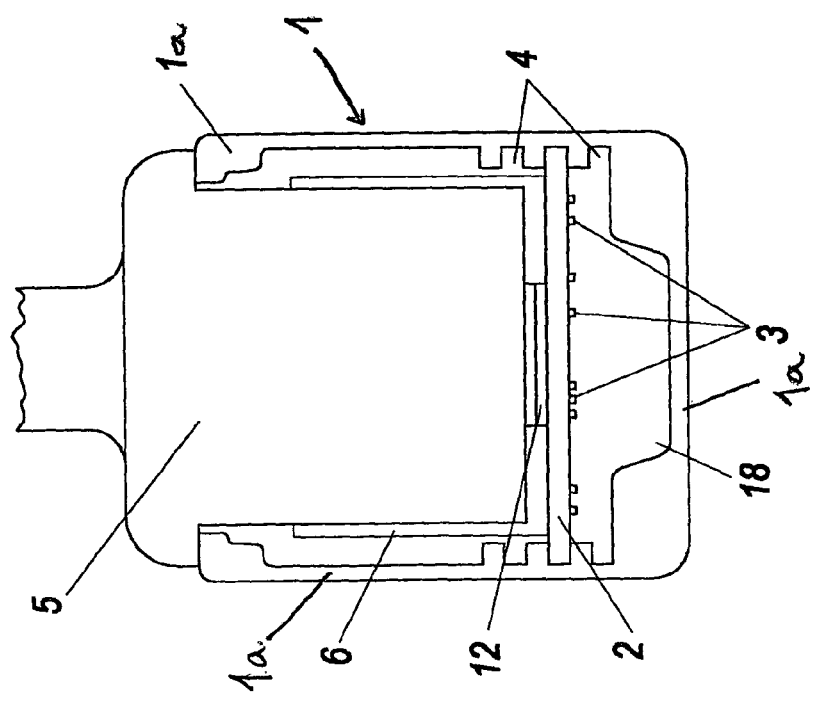
Fig. 1
Fig. 2
Fig. 3

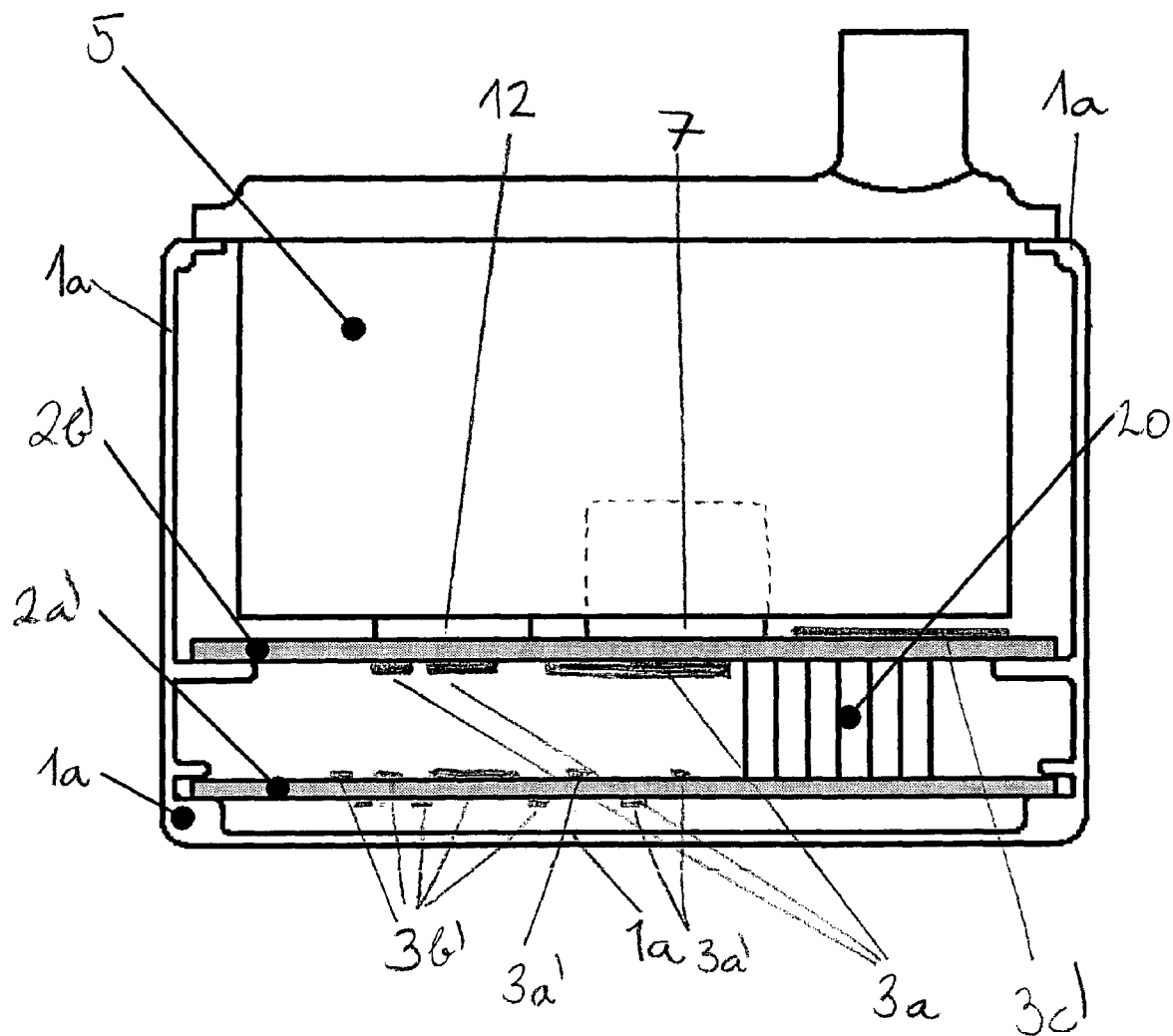

CHANNEL-SHAPED CONNECTION DEVICE FOR ELECTRICAL LINES OF INTERNAL COMBUSTION ENGINES

The invention relates to a channel-shaped connecting device for electric lines, in particular signal and ignition lines, of internal combustion engines.

To supply power to the control elements of an internal combustion engine, it is known for the electric lines to be arranged in the form of cable harnesses in the bodywork. Arranging the lines in cable channels or ducts also constitutes state of the art. A distributor channel of that kind is described for example in EP 0 607 335 B1. In terms of easily and rapidly connecting the components to be powered, to the electric lines, it has proven to be a disadvantage that, in the known devices, the individual plug sockets and the like each have to be connected to a respective line guided in the cable channel.

The object of the invention is to provide a novel connecting device of the kind set forth in the opening part of this specification, which avoids the known disadvantages.

SUMMARY OF THE INVENTION

In accordance with the invention that is achieved in that there is provided at least one carrier element for—preferably pre-assembled—electric lines and components, which can be introduced into and preferably pushed into receiving means in the channel-shaped connecting device, wherein the electric lines and the components, in accordance with a preferred embodiment, are arranged on two mutually opposite sides of the carrier element. By virtue of the arrangement of the electric lines which are advantageously pre-assembled and the components on a preferably push-in carrier element, it is possible for the plug sockets and other connections to be quickly and easily positioned in the connecting device.

In general the carrier element will be of a plate-shaped configuration. It can preferably be provided that the carrier element is a circuit board on which the electric lines which in accordance with a further aspect of the invention can be in the form of conductor tracks and/or cables are arranged, wherein it has proven to be particularly advantageous if the connecting device has a recess for receiving additional cables. For simple manufacture, it has proven to be particularly desirable if the carrier element at least in part is of a modular structure, wherein for quick and easy assembly it can further be provided that the individual modules of the carrier element are electrically and/or mechanically—preferably releasably—connected together. Thus, for adaptation to the most widely varying design configurations and in dependence on whether a cylinder of the internal combustion engine is associated with each module of the carrier element or whether a plurality of and preferably two cylinders of the internal combustion engine are associated with each module of the carrier element, it is possible to assemble a modular circuit board chain or section which corresponds to the respective requirements involved and which subsequently only has to be introduced into the connecting device, preferably by being pushed or pulled thereinto. It will be appreciated that this functional principle is not restricted to modular carrier elements in the form of circuit boards, but can be applied in relation to all kinds of carrier elements, for example also in the case of a carrier element in the form of an aluminum extrusion.

In order further to reduce the amount of work involved for connecting the control elements of the internal combustion engine, which are to be supplied, it can advantageously be provided that at least a part of the components which in accordance with an embodiment of the invention include an ignition coil and/or sensor and/or actuator modules—in accordance with a further aspect of the invention also the ignition circuit for operating the ignition coil—can be non-releasably fixed to the carrier element before the carrier element is introduced into the connecting device.

The same effect is achieved if at least a part of the components is arranged releasably on the carrier element and plug devices are provided for releasably holding the components.

For this embodiment of the invention, it is desirable if the connecting device has receiving openings for the components which are to be releasably arranged, and if the components which are to be releasably arranged can be fitted through those receiving openings from the outside into the connecting device and connected to the carrier element, in which respect a preferred alternative embodiment provides that the connecting device has a specific opening for each component.

The material for manufacture of the connecting device can preferably be aluminum. However many other materials such as for example hard plastic materials or iron are also suitable, in which respect a further embodiment provides that the connecting device is at least partially filled with foam, for example with PU foam.

BRIEF DESCRIPTION OF THE DRAWINGS

Further advantages and details are described with reference to the accompanying drawing in which:

FIG. 1 is a view in cross-section through an embodiment of a connecting device according to the invention, FIG. 2 is a plan view of a modular carrier element, FIG. 3 is a view in cross-section through FIG. 2 taken along line A, FIG. 8 shows a view in cross-section of an alternative embodiment of the structure shown in FIG. 1.

Figure 4:
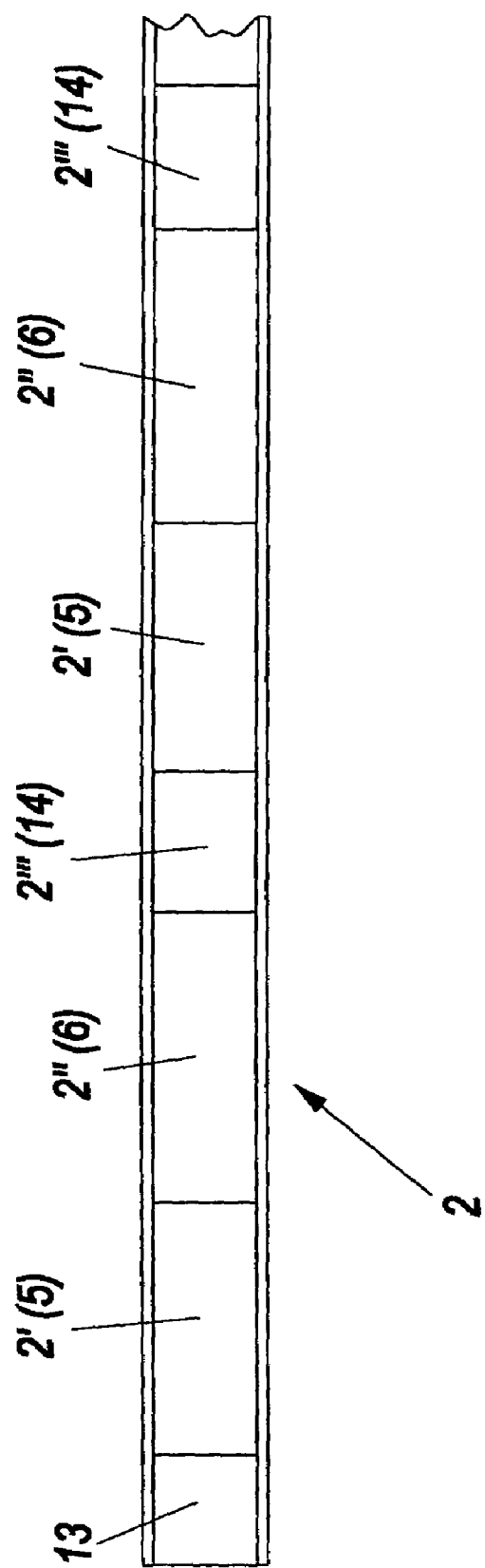
FIG. 4 shows an embodiment of a modular carrier element.

The channel-shaped connecting device 1 shown in FIG. 1 has in the wall 1a receiving means 4 into which the carrier element 2 is inserted, wherein advantageously the device has a plurality of mutually spaced receiving means 4, for adaptation to the size of the components. The electric lines 3, preferably in the form of conductor tracks 3', are arranged at one side of the carrier element 2. The connecting device 1 has a corrugation or recess 18 for receiving additional cables. Disposed on the other side of the carrier element 2 beside the plug device 12 at which the ignition coil 5 is releasably arranged in this embodiment of the connecting device 1 according to the invention are measurement modules 6 which were already non-releasably fixed to the carrier element 2 before it was introduced into the connecting device 1. It will be appreciated that, to avoid damage, for example as a consequence of vibration or major fluctuations in temperature, in the engine compartment, it is possible to take protective measures such as partially filling the connecting device 1 with for example PU foam, introducing silicone packs, heat insulation or the like.

FIG. 2 shows a plan view of a modular carrier element, wherein the individual modules 2', 2", 2''' are mechanically and electrically connected together. The modules 2' and 2" form a straight join 9, while the electrical and the mechanical connection between those two modules 2', 2" of the carrier element 2 is made by means of wire connectors 10. In contrast the modules 2" and 2''' are mechanically connected by way of a positively locking join 8 and have plug connectors 11 for making the electrical connection. It will be appreciated that other suitable alternative forms and options for making the connections can also be envisaged. Diagrammatically illustrated on the module 2" is a non-releasably fixed component 7 and a plug device 12 into which a further component 7 can be releasably introduced through a receiving opening 16 in the connecting device 1, after the carrier element 2 has been fitted into the connecting device 1.

It will be seen from FIG. 3 that conductor tracks 3' are disposed at the underside of the modules 2', 2", 2'''. It will be appreciated that they may also extend in a portion-wise manner transversely with respect to the longitudinal direction of the channel.

FIG. 4 shows the diagrammatic structure of a modular carrier element 2. The end portion 13 of the carrier element 2 only has lines. The module 2' (5) is associated with the ignition coil 5, and the module 2" (6) is associated with a sensor/actuator module, in which respect the nature of the mounting—components 5, 6 (not shown) which are pre-assembled or which are to be fitted in position—can be selected as desired. Those modules 2', 2" have lines 3 (not shown) and components 5, 6 or plug devices 12 respectively for releasably fitting components 5, 6. The module 2''' (14) only represents a connecting module and also has only lines 3. It will be appreciated that this embodiment can be viewed only as one of many possible combinations of modules. Even if it is preferably provided that the ignition circuit for operating the ignition coil is arranged on the carrier element 2, operation of the ignition coil can also be effected externally. When the modular carrier element 2, preferably a modular circuit board line or section, is finished, it is easily inserted into the channel-shaped connecting device 1.

Figure 5:
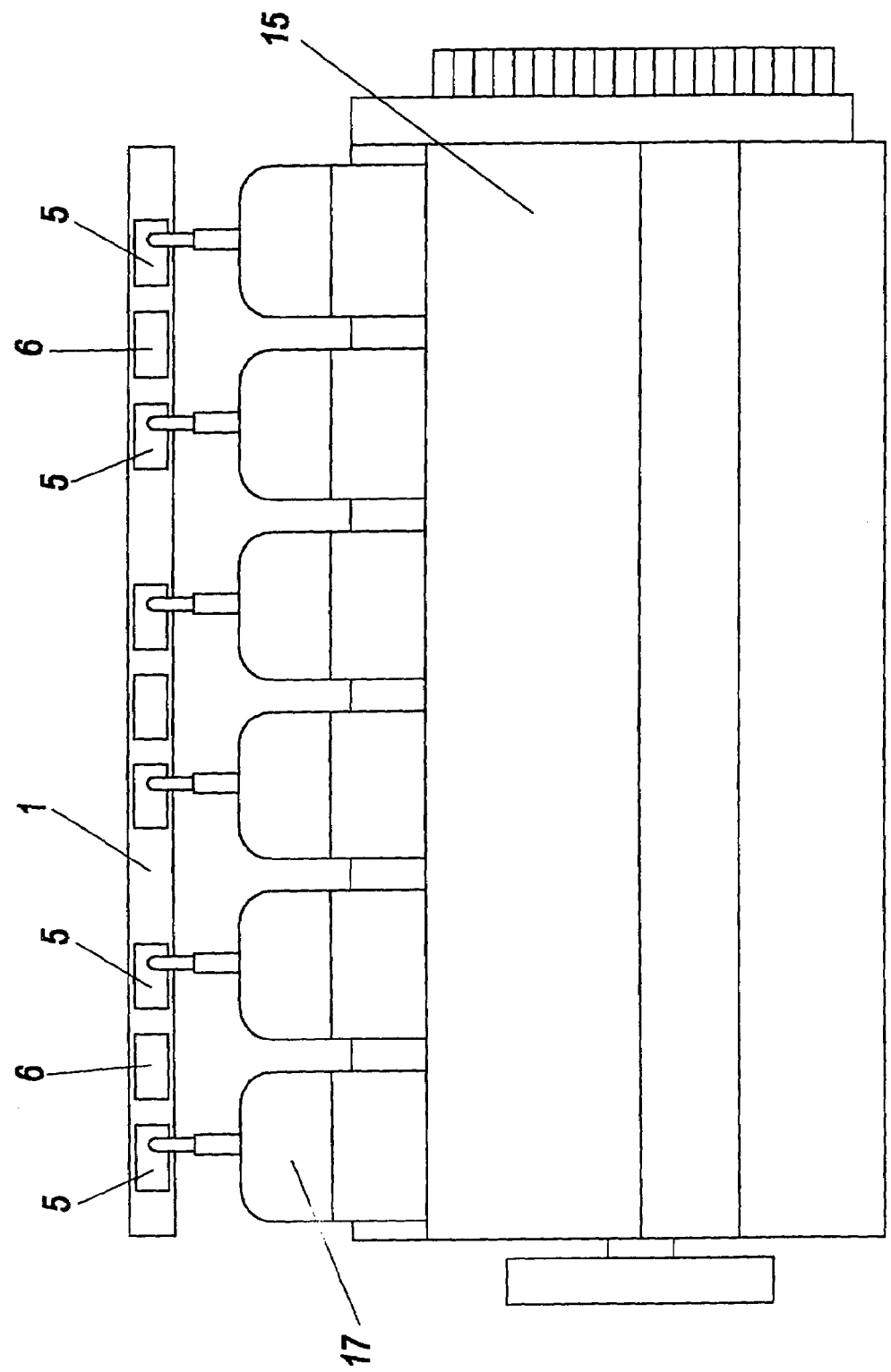
FIG. 5 shows a further embodiment on an internal combustion engine.

FIG. 5 shows an internal combustion engine 15 with cylinders 17 which are respectively connected by way of an ignition coil 5 to the carrier element 2 (not shown). Arranged between each two ignition coils 5 is a respective measurement module 6, wherein the ignition coil 5 and the measurement module 6 were introduced into the connecting device through receiving openings.

Figure 6:
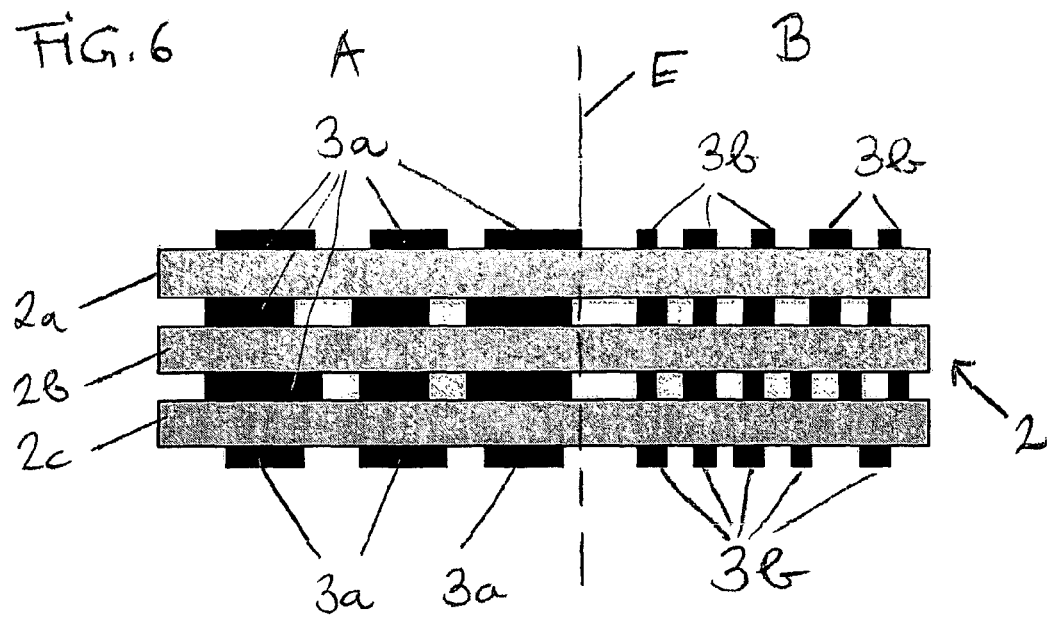
FIG. 6 shows a diagrammatic view in cross-section through a circuit board of multi-layer configuration as the carrier element.

FIG. 6 shows a preferred embodiment for the carrier element 2 which has a plurality of layers or strata 2a, 2b and 2c of electrically insulating material. In this embodiment the conductor tracks 3a and 3b are arranged on, under and between the insulating layers of the circuit board.

In this case, to avoid interference effects, the electrical ignition lines 3a which supply ignition signals for the ignition coils on the one hand and the signal lines 3b on the other hand which transmit measurement signals from sensors arranged on the internal combustion engine can be arranged in spatially separate regions A and B respectively on the carrier element 2. In the illustrated embodiment these spatially separate regions A and B are disposed to the left and to the right of a longitudinal central plane E. That is particularly advantageous if the ignition lines 3a are in the form of high-tension lines with voltages of preferably over 100V, which directly feed the ignition coils 5. By virtue of that left-right separation those ignition lines then cannot interfere with the measurement signals carried on the signal lines 3b, in spite of the high voltages carried on the ignition lines.

Figure 7:
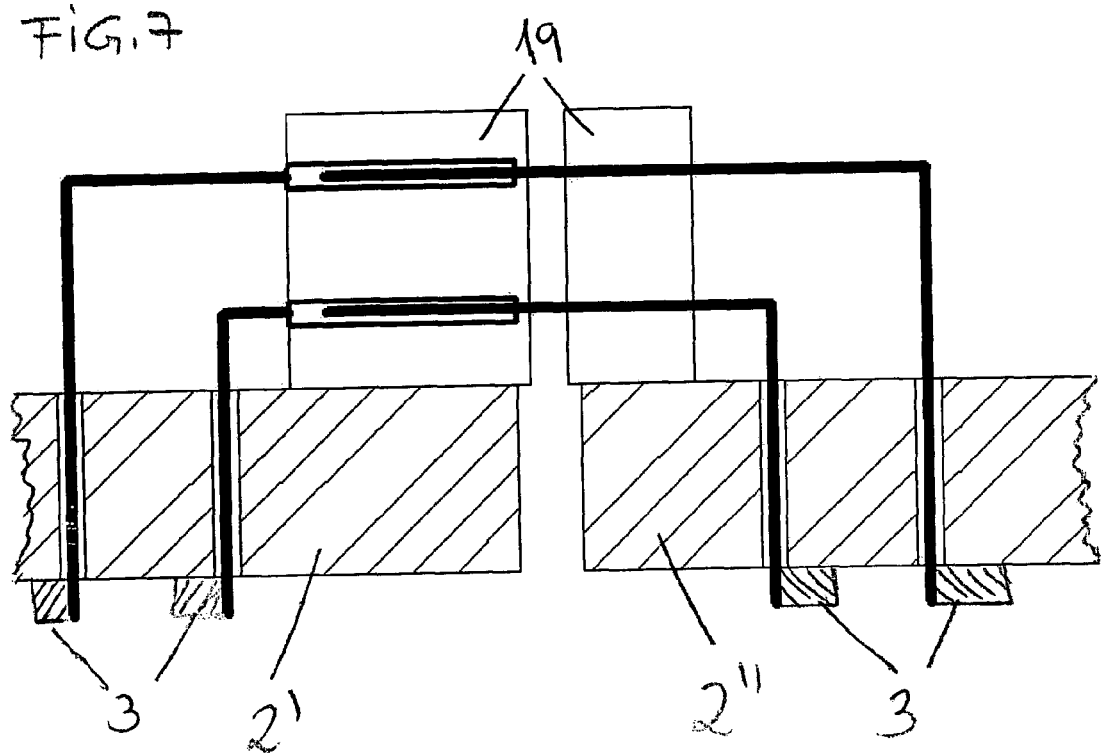
FIG. 7 shows an electrical plug connection at the end between two modules of a carrier element.

FIG. 7 shows an embodiment with an electrical plug device 19 between the modules 2' and 2". In that way the circuit boards 2' and 2" can be easily electrically connected together, while even an additional mechanical holding effect is releasably afforded by way of the plug connection. Overall, by means of such plug connections 19, it is possible to make up an entire circuit board line or chain which can then be pushed in the axial longitudinal direction into the substantially closed channel. More specifically, it is preferably provided that the channel-shaped connecting device has a channel wall 1a which is in one piece in cross-section and which is closed—possibly except for discretely distributed openings 16—and which extends continuously in the longitudinal direction of the channel preferably over at least two cylinders of the internal combustion engine. That construction makes it possible to achieve a robust structure which is insensitive to interference and disturbances. If the channel is closed substantially in one piece, as is the case in the preferred embodiment, the carrier element 2 or the 'chain' formed from a plurality of successively connected modules will be pushed into the channel in the axial longitudinal direction.

FIG. 8 shows an alternative embodiment in relation to FIG. 1, with in this case two separate, mutually superposed carrier elements 2a' and 2b'. The lower carrier element 2a' carries signal lines or measurement lines 3b' in the form of conductor tracks and—also in the form of conductor tracks—ignition control lines 3a'. Those ignition control lines 3a' do not carry a high voltage but essentially only the information as to when which cylinder is to be fired. The actual high voltage for the ignition coils 5' is carried by way of a wide conductor track (high-tension line 3c') on the upper circuit board 2b'. The upper and lower circuit boards are connected together by way of a board plug connector 20. In this embodiment the ignition control lines 3a' and the signal lines 3b' can readily extend in spatial proximity as the ignition control lines 3a' do not carry any troublesome or interfering high voltages.

The actual ignition voltages are formed by an electronic ignition circuit 7 on the circuit board 2b', more specifically in dependence on the signals which are supplied on the ignition control lines 3a' by way of the plug connection 20, and using the high voltage on the line 3c'. The actual ignition signals formed in that way then pass into the ignition coil 5 by way of the ignition lines 3a and the plug 12. It will be appreciated that here too the conductor tracks are only diagrammatically illustrated. They may also extend transversely with respect to the longitudinal direction of the channel and possibly in a plurality of layers.

The invention claimed is:

1. A channel-shaped connecting device for electric lines of internal combustion engines, wherein there is provided at least one carrier element for electric lines and components, which can be introduced into receiving means of the channel-shaped connecting device, wherein the carrier element is at least partially of a modular structure and a plurality of modules of the carrier element, which are arranged in a row in succession in the longitudinal direction of the channel-shaped connecting device, are mechanically connected together in a way that they form a module chain, which can be introduced into the channel-shaped connecting device.

2. A channel-shaped connecting device as set forth in claim 1, wherein the electric lines are signal and ignition lines.

3. A channel-shaped connecting device as set forth in claim 1, wherein the electric lines and components are pre-assembled on the carrier element.

4. A channel-shaped connecting device as set forth in claim 1, wherein the modules of the carrier element are releasably connected together.

5. A channel-shaped connecting device as set forth in claim 1, wherein the modules form a module chain in the longitudinal direction of the channel-shaped connecting device.

6. A channel-shaped connecting device as set forth in claim 1, wherein the modules of the carrier element are mechanically connected together in a way, that the module chain formed from the modules can be pushed or pulled into a channel-shaped connecting device which is closed substantially in one piece.

7. A channel-shaped connecting device as set forth in claim 1, wherein the modules of the carrier element are mechanically connected by means of wire connectors or by means of a positively locking join or by means of an electrical plug device.

8. A channel-shaped connecting device as set forth in claim 1, wherein the electric lines and the components are arranged on two mutually opposite sides of the carrier element.

9. A channel-shaped connecting device as set forth in claim 1, wherein the electric lines are in the form of conductor tracks.

10. A channel-shaped connecting device as set forth in claim 1, wherein the electric lines are in the form of cables.

11. A channel-shaped connecting device as set forth in claim 1, wherein at least one electric line is in the form of a cable and at least one electric line is in the form of a conductor track.

12. A channel-shaped connecting device as set forth in claim 1, wherein the carrier element is of a plate-shaped configuration.

13. A channel-shaped connecting device as set forth in claim 1, wherein the carrier element is in the form of a circuit board.

14. A channel-shaped connecting device as set forth in claim 1, wherein the carrier element has a plurality of layers.

15. A channel-shaped connecting device as set forth in claim 14, wherein the carrier element is in the form of a multi-layer circuit board.

16. A channel-shaped connecting device as set forth in claim 14, wherein at least one electric line is in the form of a conductor track being arranged on the insulating layers of the circuit board.

17. A channel-shaped connecting device as set forth in claim 14, wherein at least one electric line is in the form of a conductor track being arranged under the insulating layers of the circuit board.

18. A channel-shaped connecting device as set forth in claim 14, wherein at least one electric line is in the form of a conductor track being arranged between the insulating layers of the circuit board.

19. A channel-shaped connecting device as set forth in claim 14, wherein the electric ignition lines which supply ignition signals for the ignition coils on the one hand and the signal lines on the other hand are arranged on the carrier element in spatially separate regions (FIG. 6).

20. A channel-shaped connecting device as set forth in claim 19, wherein the signal line transmit measurement signals from sensors arranged on the internal combustion engine.

21. A channel-shaped connecting device as set forth in claim 19, wherein the electric ignition lines and the signal lines are arranged substantially to the left and the right of a longitudinal central plane of the carrier element.

22. A channel-shaped connecting device as set forth in claim 1, wherein at least one ignition line is in the form of a high-voltage line directly feeding at least one ignition coil.

23. A channel-shaped connecting device as set forth in claim 22, wherein the high voltage line involves voltages over 100 V.

24. A channel-shaped connecting device as set forth in claim 22, wherein at least one ignition line is in the form of an ignition control line and at least one high-voltage line is arranged on a carrier element, wherein associated with each ignition coil is an electronic ignition circuit which is arranged on a carrier element and which in dependence on the signals on the ignition control lines and the voltage on the high-voltage line produces an ignition signal which is fed to the respective ignition coil.

25. A channel-shaped connecting device as set forth in claim 1, wherein at least two separate carrier elements are introduced into the channel-shaped connecting device.

26. A channel-shaped connecting device as set forth in claim 25, wherein the separate carrier elements are mutually superposed.

27. A channel-shaped connecting device as set forth in claim 25, wherein the separate carrier elements are pushed into the channel-shaped connecting device.

28. A channel-shaped connecting device as set forth in claim 25, wherein the ignition control lines and the signal lines are arranged on a carrier element other than the high-voltage line.

29. A channel-shaped connecting device as set forth in claim 1, wherein the modules of the carrier element, which are arranged in a row in succession in the longitudinal direction of the channel, are electrically connected together.

30. A channel-shaped connecting device as set forth in claim 29, wherein an electrical plug connection is provided between the individual modules in their end region.

31. A channel-shaped connecting device as set forth in claim 1, wherein each module of the carrier element is associated with at least one cylinder of the internal combustion engine.

32. A channel-shaped connecting device as set forth in claim 1, wherein each module is associated with two cylinders of the internal combustion engine.

33. A channel-shaped connecting device as set forth in claim 1, wherein the components include at least one ignition coil.

34. A channel-shaped connecting device as set forth in claim 1, wherein the components include at least one sensor.

35. A channel-shaped connecting device as set forth in claim 1, wherein the components include at least one actuator module.

36. A channel-shaped connecting device as set forth in claim 33, wherein the components include an ignition circuit for operation of the ignition coil.

37. A channel-shaped connecting device as set forth in claim 1, wherein at least a part of the components are non-releasably fixed to the carrier element before the carrier element is introduced into the connecting device.

38. A channel-shaped connecting device as set forth in claim 1, wherein at least a part of the components is arranged releasably on the carrier element.

39. A channel-shaped connecting device as set forth in claim 2, wherein plug devices are provided on the carrier element for releasably holding the components.

40. A channel-shaped connecting device as set forth in claim 1, wherein the connecting device has receiving openings for components which are to be releasably arranged and which can be inserted through said receiving openings from the exterior into the connecting device and connected to the carrier element.

41. A channel-shaped connecting device as set forth in claim 40, wherein the connecting device has for each component its own receiving opening.

42. A channel-shaped connecting device as set forth in claim 1, wherein the connecting device has a recess for receiving additional cables.

43. A channel-shaped connecting device as set forth in claim 1, wherein it has a channel wall which is in one piece in cross-section and which is closed—possibly except for discreetly distributed openings—and which extends continuously in the longitudinal direction of the channel.

44. A channel-shaped connecting device as set forth in claim 43, wherein the channel wall extends over at least two cylinders of the internal combustion engine.

45. A channel-shaped connecting device as set forth in claim 1, wherein the connecting device is made from aluminium.

46. A channel-shaped connecting device as set forth in claim 1, wherein the connecting device is at least partially foam-filled, for example with PU foam.

\* \* \* \* \*